United States Patent

Hofsaess

[11] Patent Number: 5,696,777
[45] Date of Patent: Dec. 9, 1997

[54] DEVICE FOR THE SERIAL TRANSMISSION OF DATA BETWEEN AT LEAST TWO TERMINALS

[75] Inventor: Michael Hofsaess, Vaihingen, Germany

[73] Assignee: Robert Bosch, GmbH, Stuttgart, Germany

[21] Appl. No.: 378,422

[22] Filed: Jan. 26, 1995

[30] Foreign Application Priority Data

Feb. 8, 1994 [DE] Germany .................. 44 03 899.2

[51] Int. Cl.⁶ ...................................... G06F 15/40
[52] U.S. Cl. ............... 371/68.1; 371/67.1; 371/20.1; 324/509; 324/541; 370/242
[58] Field of Search ................... 371/67.1, 20.1, 371/63, 20, 20.4, 20.6, 68.2, 68.1, 22.1, 36, 57.2; 324/509, 541; 327/74, 75, 76; 370/24, 13, 14, 15, 16, 17, 242, 248, 249; 395/182.02, 185.09, 185.01, 185.04

[56] References Cited

U.S. PATENT DOCUMENTS

| | | | |
|---|---|---|---|
| 3,634,665 | 1/1972 | Carter | 371/63 |
| 3,825,682 | 7/1974 | Phillips | 178/69 G |
| 4,638,482 | 1/1987 | Griffin et al. | 371/63 |
| 4,782,300 | 11/1988 | Bonaccio et al. | 324/509 |
| 5,124,990 | 6/1992 | Williamson | 371/20.6 |
| 5,267,251 | 11/1993 | Lenoir et al. | 371/57.2 |
| 5,336,947 | 8/1994 | Lehning | 327/18 |
| 5,357,518 | 10/1994 | Peter | 395/182.02 |

FOREIGN PATENT DOCUMENTS

| | | |
|---|---|---|
| 239731 | 10/1987 | European Pat. Off. . |
| 416679 | 3/1991 | European Pat. Off. . |
| 506237 | 9/1992 | European Pat. Off. . |
| 529602 | 3/1993 | European Pat. Off. . |
| 3700284 | 6/1988 | Germany . |
| 3826774 | 2/1990 | Germany . |

Primary Examiner—Phung My Chung
Attorney, Agent, or Firm—Kenyon & Kenyon

[57] ABSTRACT

A device for the serial transmission of data between at least two terminals which are interconnected via a two-wire line. Each terminal has a bus-coupling circuit having at least one transmitting section or one receiving section. The transmitting section has at least two driver circuits which are each connected to one line of the two-wire line. A resistor network is switched between each driver circuit and line. During a data transmission, the transmitting section transmits complementary signals to the lines. The receiving section has a comparator which is connected at its one input to a line of the two-wire line and which is supplied at its second input with a specific reference potential. The output signals from the comparators are evaluated by an evaluation circuit. The reference potentials of the comparators and the resistor networks are designed to allow both comparators to emit a switching signal, in dependence upon the transmitted bit conditions, in the case of an error-free operation. The reference potentials and the resistor networks are designed to allow one of the comparators to emit a switching signal, in dependence upon the transmitted bit conditions, and to allow the other comparator to remain in one of the two circuit states, in the case of a short-circuit of one of the lines to any voltage potential whatsoever or in the case of a short-circuit of the lines between themselves.

9 Claims, 4 Drawing Sheets

DEVICE FOR THE SERIAL TRANSMISSION OF DATA BETWEEN AT LEAST TWO TERMINALS

FIELD OF THE INVENTION

The present invention relates to a device for the serial transmission of data between at least two terminals.

BACKGROUND INFORMATION

A device for the serial transmission of data between two terminals is described in U.S. Pat. No. 4,782,300. This patent describes a transceiver which is suitable for connection to a serial two-wire bus. Means are provided in the transceiver to detect fault conditions on the bus lines, such as short circuits and open circuits. To detect open circuits, two comparators are provided, which are each supplied with the signals from one of the two bus lines as well as with a reference voltage. If a freewheeling (open-circuit) condition occurs on one of the bus lines, one of the comparators detects this and supplies an appropriate signal. To detect short-circuit conditions on one of the bus lines, the transceiver is set to a special "diagnostic mode." In this mode, the individual lines are supplied with predetermined signals. By comparing the transmitted data to a signal received via a differential receiver, the short-circuit state existing on the bus lines can then be identified. The fault can then be rectified by service repair personnel.

SUMMARY OF THE INVENTION

In comparison, the device according to the present invention has the advantage of not only detecting a fault condition on the bus lines, but also maintaining the bus connection in the case that a single fault exists on the bus lines. This means that in spite of the individual fault that has occurred, data can be transmitted via the two-wire bus connection. An individual fault should be understood here as, for example, the interruption of a bus line, a short-circuit of one of the bus lines with any voltage potential at all, and a short-circuit of the bus lines among themselves.

The device according to the present invention is designed to allow a data transmission to take place via the two-wire bus line in spite of the presence of one of the enumerated faults. The device is thus designed to be fault-tolerant and can be employed in particular for bus connections which are critical to safety and run between two terminals inside a motor vehicle.

It is furthermore advantageous that the device according to the present invention is designed to react very quickly to a fault that has occurred and to be available again for a data transmission. If a byte-oriented data-transmission protocol is used for the data transmission, then a maximum of one transmitted byte can be corrupted by a single fault that has occurred. After the circuit in the device of the present invention has reacted, the data transmission can be continued in spite of the existence of the individual fault, the bytes to be transmitted being transmitted in a fault-free manner. Since the device is designed to be fault-tolerant in terms of circuitry, a simple data-transmission protocol can be used for transmitting data. A simple check-sum test suffices, for example, for the data protection.

An especially favorable wiring configuration of the drivers for the individual lines of the two-wire bus connection according to the present invention ensures that even given a short-circuit between the two lines of the two-wire bus connections, discrete signal levels can be transmitted via the bus line, which can then be evaluated by the receiving section of the receiving terminal.

It is furthermore advantageous that the driver circuits for both bus lines are able to be driven via a common terminal connection. In this manner, the circuit expenditure is kept to a minimum. In particular, an associated microcomputer can drive the driver circuits through a single terminal connection, so that only one microcomputer output connector pin is required for this purpose.

The device according to the present invention also provides an advantageous choice of reference potentials for the two comparators of the receiver circuit. A reference potential is applied in the middle of the voltage potentials resulting from a short-circuit of the bus lines among themselves for transmitting the two possible bit conditions. The voltage levels still transmitted can also be optimally evaluated in the short-circuit case. The circuit is then also designed to offer the greatest possible protection against possible mass frame skews between the terminals of the bus connection.

It is likewise advantageous that the evaluation circuit according to the present invention combines the switching signals of the comparators in a logic AND or a logic OR operation. These logic gates are especially easy to integrate and do not entail greater circuit expenditure.

It is furthermore advantageous that the selection of the logic AND and of the logic OR operation takes place with the help of logic gates and that the selection result is stored in a bistable circuit element, for example a flip-flop circuit. In this manner, a fault-tolerant evaluation circuit is produced, which correctly evaluates the switching signals from the comparators, even after one single fault has occurred.

It is likewise advantageous that the evaluation circuit according to the present invention contains means for detecting a fault condition and supplying a fault signal to the microcomputer. The microcomputer can then process the fault signal, store the fault word or activate a display, for example in a motor vehicle. It is furthermore advantageous in this case that a logic EXCLUSIVE-OR gate is linked to the output lines of the comparators as a means for detecting a fault condition. In addition, it is advantageous that a low-pass filter is connected to the EXCLUSIVE-OR gate in outgoing circuit to suppress transient pulses at the output of the EXCLUSIVE-OR gate.

For a bus-coupling circuit for the device according to the present invention for transmitting data via a two-wire bus connection, it is advantageous that, depending on the terminal, it contain either only the transmitting section or only the receiving section, or the transmitting and receiving section. If the bus connection is used, for example, for linking an "intelligent" sensor to a control unit, then in the "intelligent" sensor, one merely needs to provide a bus-coupling circuit, for example, which contains the transmitting section, since data does not necessarily have to be transmitted from the control unit to the sensor.

DETAILED DESCRIPTION OF THE INVENTION

Figure 1:
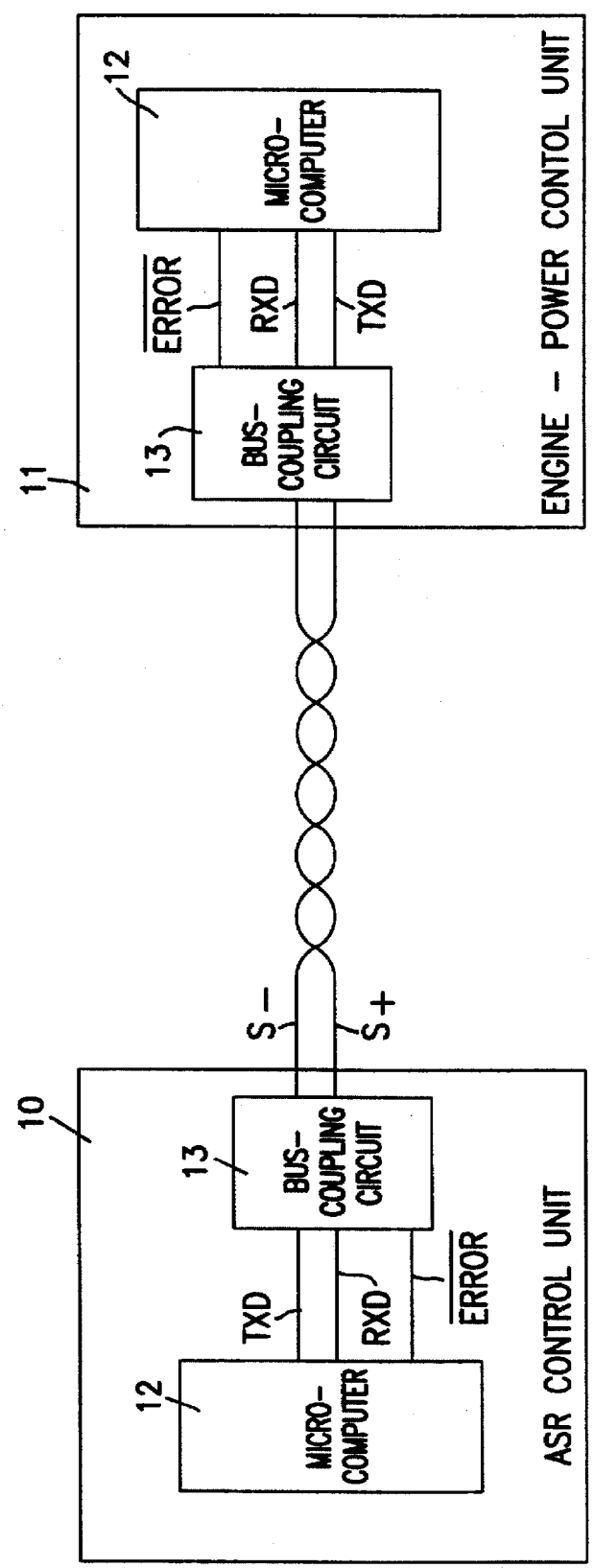
FIG. 1 shows a basic block diagram of the device according to the present invention.

The device according to the present invention for serial data transmission can generally be used for computer networks, and in particular, for connecting two terminals, which need to exchange data between them. The device for transmitting data is especially suited for application in motor vehicles because of its fault tolerance. The present invention will be described in the following on the basis of this example. In FIG. 1, the reference numeral 10 denotes an ASR (traction control system) control unit. The reference numeral 11, on the other hand, denotes an engine-power control unit. Both control units are coupled to one another via the connecting lines S+ and S-. For this purpose, both control units have a bus-coupling circuit 13. Terminal connections TXD and RXD lead out from the bus-coupling circuit 13, each to a microcomputer 12 in the control units 10 and 11.

Data is continuously exchanged between the engine-power control unit 11 and the ASR traction control unit 10. This is necessary, for example, for a traction control system. Based on analysis of the signals from the wheel-speed sensors, the ASR control unit detects whether the wheels are experiencing slippage. If this is the case, the engine-power control unit 11 must reduce the throttle-valve setting in order to decrease wheel torque and ensure that the wheels no longer experience slippage. In the following, the special design of the individual control units is not significant, so that it will not be described further.

Figure 2:
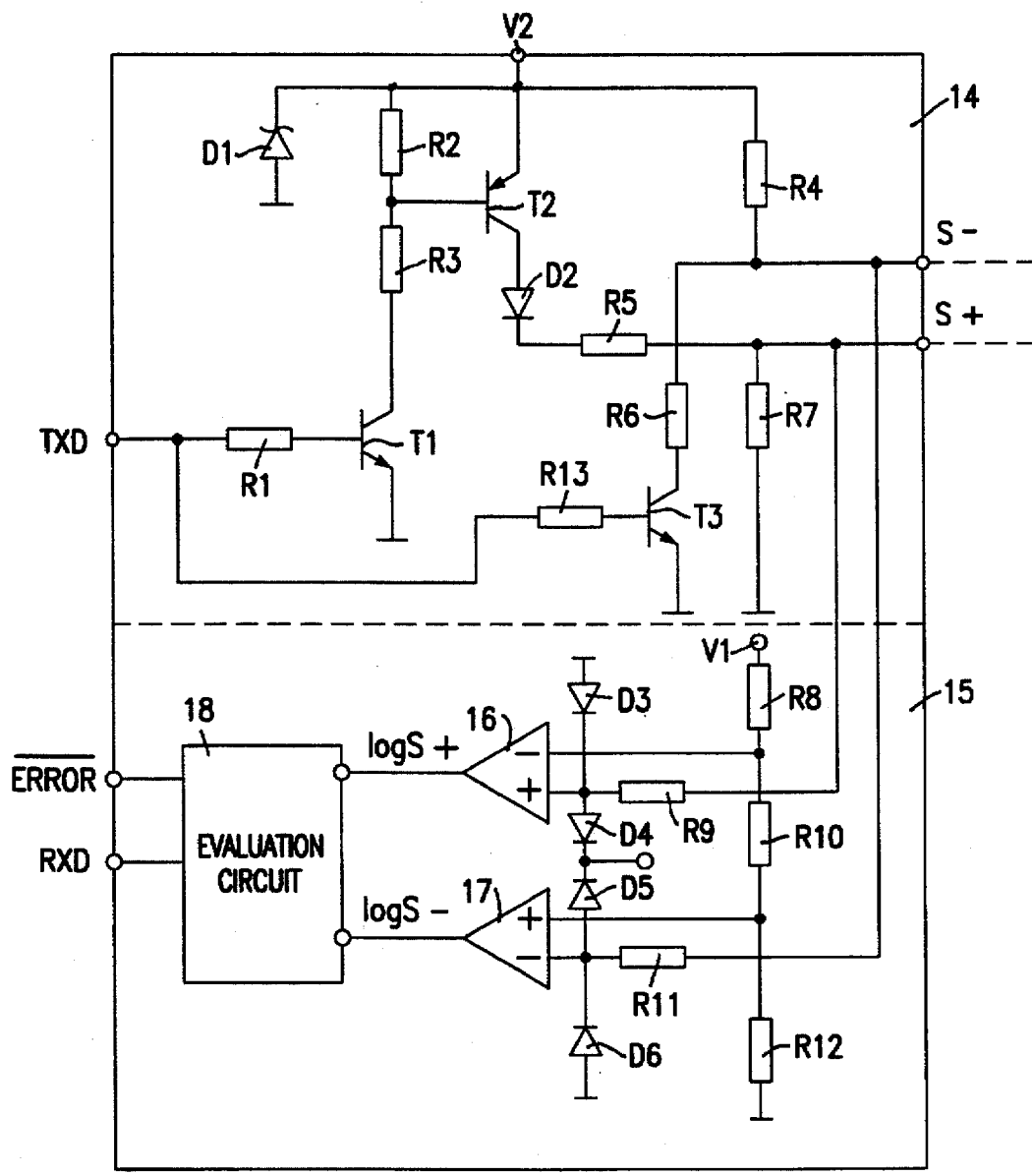
FIG. 2 shows a circuit diagram of a bus-coupling circuit of the device according to the present invention comprising both a transmitting section and a receiving section.

The bus-coupling circuit 13, which is contained in each of the control units 10 and 11, is shown in greater detail in FIG. 2. Reference numeral 14 denotes the transmitting section of this bus-coupling circuit, and reference numeral 15 refers to the receiving section. The transmitting section 14 will be explained below.

A line leads from the TXD connection terminal via a resistor R1 to an NPN transistor T1. For the exemplary embodiment, the resistor R1 has a value of 1K ohm. The emitter of the transistor T1 is connected to ground. At the collector of the transistor T1, two resistors R3 and R2 are connected in series to a supply-voltage potential V2. In the exemplary embodiment of FIG. 2, the resistors R3 and R2 likewise each have a value of 1K ohm. Furthermore, a Zener diode D1 is connected to ground at the connection terminal of the supply potential V2.

Another line leads from the connecting line between the resistors R3 and R2 to the base of a PNP transistor T2. The emitter of the transistor T2 is connected to the supply-voltage potential V2. The collector of the transistor T2 leads, via a diode D2 switched in the forward (conducting) direction and a resistor R5, to the connection point of the bus line S+. In this exemplary embodiment, the resistor R5 has a resistance of 200 ohm. A resistor R7 is connected to ground between the resistor R5 and the connection point for the bus line S+. This resistor has a value of 2K ohm.

Furthermore, a line leads from the TXD input of the bus-coupling circuit 13 via a resistor R13 to an NPN transistor T3. The resistor R13 likewise has a value of 1K ohm, in the same way as the resistor R1. The emitter of the transistor T3 is connected to ground. From the collector of the transistor T3, a resistor R6 is connected to the connection point for the bus line S-. In the exemplary embodiment, the resistor R6 has a value of 100 ohm. Another resistor R4 is connected to the supply-voltage potential V2 between the resistor R6 and the connection point for the bus line S-. In the exemplary embodiment, this resistor R4 has a value of 1K ohm.

In the following, the receiving section 15 of the bus-coupling circuit 13 shown in FIG. 2 is described. The connection point for the bus line S+ is linked via a resistor R9 to the non-inverting input of a first comparator 16. The connection point for the bus line S- is linked via a resistor R11 to the inverting input of a second comparator 16. The connection point for the bus line S- is linked via a resistor R11 to the inverting input of a second comparator 17. By way of a voltage divider comprised of three series-connected resistors R8, R10 and R12, a reference potential is supplied in each case to the inverting input of the first comparator 16 and to the non-inverting input of the second comparator 17. The resistors R8 and R10 each have an ohmage of 1K ohm; the resistor R12 has an ohmage of 2K ohm. The resistor R12 is connected to ground, and the resistor R8 is connected to a voltage potential of V1.

The voltage potential between the two resistors R8 and R10 is supplied to the non-inverting input of the first comparator 16. The voltage potential between the resistors R10 and R12 is supplied to the non-inverting input of the second comparator 17. The non-inverting input of the first comparator 16 is connected to ground via a diode D3 switched in the reverse direction, and to a supply potential V1 via a diode D4 switched in the forward direction. The inverting input of the second comparator 17 is connected via a diode D6 switched in the reverse direction to ground, and via a diode D5 switched in the forward direction to a supply-voltage potential V1. The output of the first comparator 16 is connected to the connection point LOGS+ of an evaluation circuit 18. The output of the second comparator 17 is connected to the connection point LOGS- of the evaluation circuit 18.

Figure 3:
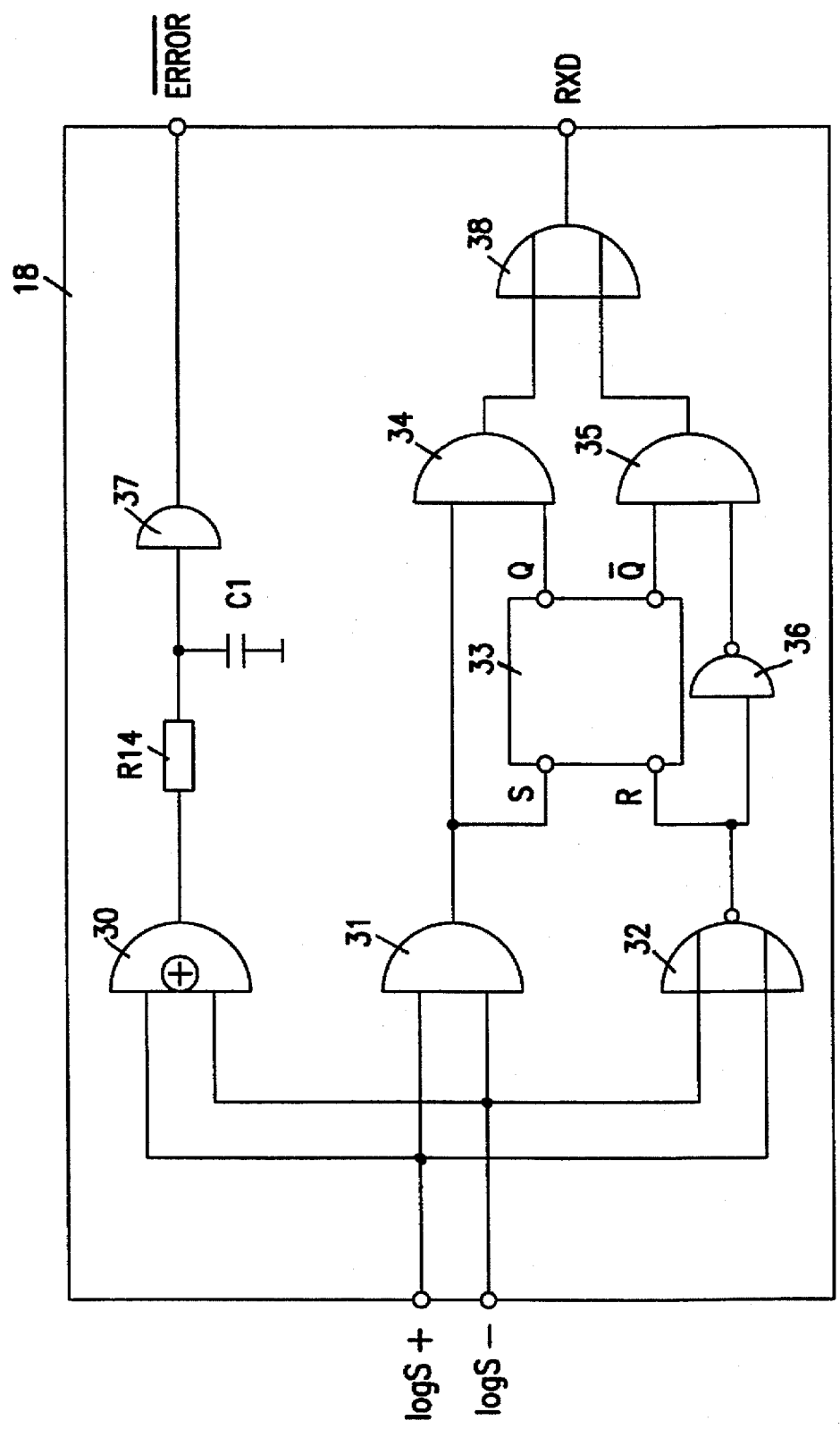
FIG. 3 shows a circuit diagram for an exemplary evaluation circuit of the receiving section of the bus-coupling circuit according to the present invention.

The evaluation circuit 18 is clarified still more precisely in FIG. 3. On the output side, a connection terminal of the evaluation circuit 18 leads to a connection point ERROR of the bus-coupling circuit 13. Another output line of the evaluation circuit 18 leads to the connection point RXD of the bus-coupling circuit 13.

Figure 4A:
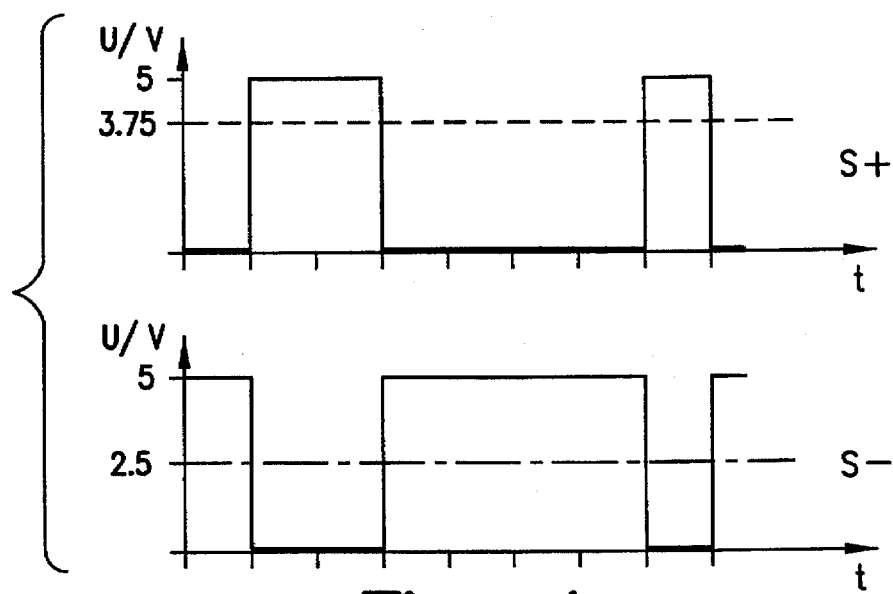
FIG. 4a illustrates the signal level on the bus lines in the normal operation of the bus lines.
Figure 4B:
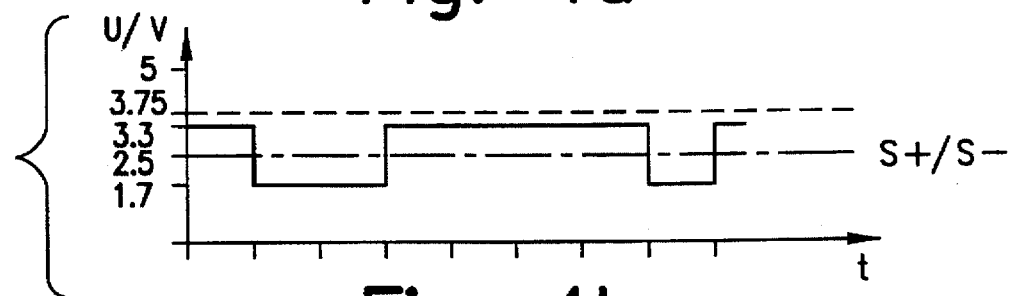
FIG. 4b illustrates the signal level on the bus lines for the case that the two bus lines are short-circuited with each other.

The functioning method of the bus-coupling circuit 13 is clarified in greater detail in the following on the basis of FIG. 4. FIG. 4a shows the voltage level on the bus lines S+ and S-, which prevails in the transmitting of the exemplary binary number word 01100001. To obtain the depicted voltage level, a voltage of slightly higher than 5 volts must be applied to the supply-voltage input V2 of the bus-coupling circuit 13. The depicted voltage levels are produced by the transmitting section 14 of the bus-coupling circuit 13.

For as long as a low potential is applied to the TXD input of the bus-coupling circuit 13, the transistor T3 is not switched into conduction, so that a voltage potential of about 5 volts is applied to the connection point for the bus line S-. For this case, the transistor T1 is likewise not switched into conduction. Thus, a high voltage is applied to the base of the PNP transistor T2, so that this transistor T2 is also not switched into conduction. Consequently, a very low voltage potential of about 0 volt is applied to the connection point for the bus line S+.

However, if a high potential is applied to the TXD input, then both the transistor T3 as well as transistors T1 and T2 are switched into conduction. The bus line S– is consequently connected via the small resistor R6 to ground, and a voltage potential of about 0 volts results at the connecting point for the bus line S–. Conversely, by switching on the transistor T2, the connecting point for the bus line S+ is raised to high voltage potential, i.e., about 5 volts. Thus, for as long as there are not individual faults on the bus lines, complementary voltage levels are produced on the bus lines S+ and S– when individual binary states are transmitted. This can be perceived clearly in FIG. 4a.

The next case to be considered is a short-circuiting between bus line S+ and S– because of a defect. Thus, the voltage levels are the same on both bus lines. This case is depicted in greater detail in FIG. 4b. The assumption here, again, is that a low potential is applied to the TXD input. Again, as a result, all transistors T1, T2 and T3 are not switched into conduction. Since there is a short-circuit between the bus lines, a voltage potential of about 3.3 volts sets in across the resistors R4 and R7. This potential sets in, because the resistor R7 is twice as large as the resistor R4.

If, on the other hand, a high potential is applied to the TXD input, then the transistors T1, T2 and T3 are again switched into conduction, and the voltage levels on the bus lines S+ and S– are determined by the voltage divider which is composed of the resistors R5 and R6. Since the resistor R5 is twice as large as the resistor R6, a voltage potential of about 1.7 volts will set in. One can clearly perceive from FIG. 4b that a significant change in the voltage potentials takes place on the bus lines S+ and S– for the two binary states low/high to be transmitted. This change in the potential level comes about because the transistors T2 and T3 are connected via a resistor network R5, R7 and R6, R4 to the bus lines S+, S–, the resistors R5, R6 and R7, R4 having the same resistance ratios. As a result of the unbalanced rating of the resistors R5, R6 and R4, R7, a signal remains even when there is a short-circuiting between the two bus lines S+ and S–, which signal can be evaluated by the special position (level) of the comparator thresholds.

Figure 4C:
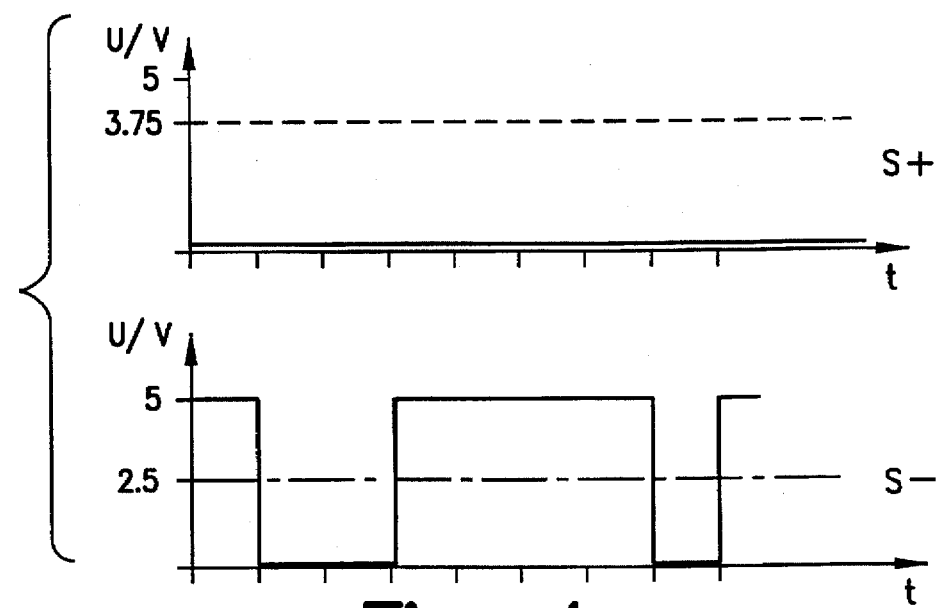
FIG. 4c illustrates the signal level on the bus lines for the case that a bus line has a short-circuit to ground.

In the following, the case will also be considered that the bus line S+ is experiencing a short-circuit to ground potential. For this case, the signal levels on the bus lines are depicted in FIG. 4c. Since the bus line S+ is short-circuited to ground, the voltage level on this line remains at about 0 volts, when low or high potential is specified via the TXD input. However, since the bus line S– does not show a fault condition, the signal level on this line looks exactly the same as the corresponding signal flow in FIG. 4a.

The functioning method of the receiving section 15 of the bus-coupling circuit 13 is clarified in greater detail in the following. A reference potential of three-fourths of the supply voltage V1 is supplied to the first comparator 16 via its inverting input 16. In the exemplary embodiment, this voltage potential amounts then to about 3.75 volts. In FIG. 4, this potential is drawn in with a dotted line. The comparator 16 evaluates whether the voltage potential of the connected bus line S+ exceeds the supplied reference-voltage potential. When the voltage potential on the bus line S+ exceeds the adjusted reference value of ¾ V2, the output of the comparator 16 carries a high potential. For the case that the voltage level on the bus line S+ falls below the adjusted value of ¾ V2, the output of the comparator 16 carries a low potential.

At its non-inverting input, a reference-voltage potential of ½ times V2 is supplied to the second comparator 17. In the exemplary embodiment, this reference-voltage potential corresponds to about 2.5 volts. This reference-voltage potential is drawn in with a dot-dash line in FIG. 4. The comparator 17 evaluates the falling below undershooting of the supplied reference voltage for the connected bus line S–. When the voltage potential on the bus line S– falls below the value of ½ V2, the output of the comparator 17 carries high potential. If a voltage potential, which is greater than the reference potential ½ V2, is applied to the bus line S–, then the output of the comparator 17 carries low potential.

The output signals from the comparators 16 and 17 are supplied to the inputs LOGS+ or LOGS–. As can be perceived in FIG. 4a, the voltage level on the bus line S– exceeds the reference potential of 2.5 volts (½ V2) when the voltage level on the bus line S+ falls below the reference potential of 3.75 volts (¾ V2), and vice versa. Thus, given normal operation, the logic levels LOGS+ and LOGS– either both carry high potential, or both carry low potential. If an individual fault occurs, a logic level, either LOGS+ or LOGS– assumes a constant value, either 1 or 0. Thus, when different signal levels are applied to the input LOGS+ and LOGS–, a fault condition is at hand. This is recognized in the evaluation circuit 18, whereupon the evaluation circuit 18 switches the ERROR output to active. The evaluation of the switching signals of the comparators 16 and 17 is clarified in greater detail in the following on the basis of FIG. 3.

A line leads from the input LOGS+ to a first input of a first AND-gate 31. A second line leads from the input LOGS– to the second input of the first AND-gate 31. Furthermore, lines lead from the LOGS+ input to a first input of an EXCLUSIVE-OR gate 30 and to a first input of an OR gate 32. From the LOGS– input, lines lead to a second input of the EXCLUSIVE-OR gate 30 and of the OR-gate 32. The output of the AND-gate 31 is connected to the set input of an RS flip-flop 33. The inverting output of the OR-gate 32 is linked to the reset input of the RS flip-flop 33. A first input of a second AND-gate 34 is connected to the output of the AND-gate 31. A line leads from the Q-output of the RS flip-flop 33 to the second input of the second AND-gate 34. The inverted output of the OR element 32 is linked, in addition, to an inverter 36. The output of the inverter 36 leads to the first input of a third AND-gate 35. The Q-output of the RS flip-flop 33 is connected to the second input of the third AND-gate 35. The output of the second AND-gate 34 leads to an input of an OR-gate 38. The output of the third AND-gate 35 leads to the second input of the OR-gate 38. The output of the OR-gate 38 is connected to the RXD terminal connection of the evaluation circuit. The output of the EXCLUSIVE-OR gate 30 is switched by way of a low-pass circuit including a resistor R14, a capacitor C1, and an inverter 37. The output of the inverter 37 leads to the ERROR-output of the evaluation circuit 18.

The functioning method of the evaluation circuit 18 is clarified in the following in conjunction with Table 1. The normal case and possible individual faults are listed in Table 1. One can perceive that in the case of one individual fault, one of the two inputs LOGS+ or LOGS– remains in a certain level condition, even when the transmitting section of one terminal has output a level change to both bus lines. Furthermore, it can be clearly perceived in the Table that, in spite of an individual fault, the RXD output releases a correct change in the signal level. At the same time, however, a fault signal is also output via the ERROR output.

In the normal case, the combination LOGS+=1 and LOGS–=1 is evaluated as in the case of the logic AND operation and a 1 appears at the RXD output. The combination of LOGS+=0 and LOGS-=0 is evaluated as in the case of a logic OR operation and a zero appears at the RXD output. The type of logic operation selected takes place with the help of the RS flip-flop 33. This is constantly switched over, so that the signals at the inputs LOGS+ and LOGS- are either evaluated in the case of a logic AND operation or as in the case of a logic OR operation.

An example to be considered here is the short-circuit case, in which the line S+ is short-circuited to ground. If the 0-level is applied to the input LOGS+ and the 1-level to the input LOGS-, then the RXD-output exhibits the 1-level. If the 0-level is applied to the input LOGS+, and the 0-level to the input LOGS-, then the RXD-output exhibits the 0-level. The levels at the inputs LOGS+ and LOGS- are thus evaluated as in the case of the OR type of operation. One can perceive from the Table that for the case that one of the inputs LOGS+ or LOGS- constantly has a 1-level being applied, the circuit arrangement is designed so as to evaluate the input signals at the inputs LOGS+ and LOGS- as in the case of the AND operation, and that for the case that one of the inputs constantly has the 0-level being applied, the input signals of the inputs LOGS+ and LOGS- are constantly evaluated as in the case of the OR operation. The type of logic operation is stored in the RS flip-flop and then does not change any more.

If a fault occurs suddenly in the transmission of a data word, the worst that can happen is that this data word is transmitted as a corrupted word. All subsequent data words would then be correctly transmitted again, since the circuit arrangement has already reacted and a suitable type of logic operation has set in to evaluate the input signals. This is ensured in the case that given a usual serial data transfer, a rising and a falling edge always occurs for every data word to be transmitted. This is the case, for example, when a start and a stop bit are used for the data transmission. To also prevent a faulty transmission of a data word, a simple check-sum test can be provided in the protocol for the data transmission, so that the faulty data word is recognized and is rejected through special measures. The faulty data word can then be requested again.

The exemplary embodiment of the present invention can be modified and expanded in diverse ways. It is thus possible, for example, to design the present device so as to allow several terminals to exchange data among themselves. This would require additional hardware wiring configurations, however. In addition, the data transmission must not necessarily take place between two electronic control units. It is also possible for a data transmission to take place between an electronic control unit and an external circuit, for example an "intelligent" sensor. Such an application case is, for example, the transmitting of data between an airbag control unit and an external crash sensor.

TABLE 1

| LOGS+ | LOGS- | Commentary | Type of Logic Operation | RXD | ERROR |
|---|---|---|---|---|---|
| 1 | 1 | Normal case, active | AND | 1 | 1 |
| 0 | 0 | Normal case, passive | OR | 0 | 1 |
| 1 | 0 | Short-circuit S+ 5..16 V | AND | 0 | 0 |
| 1 | 1 | Short-circuit S+ 5..16 V | AND | 1 | 0 |
| 0 | 1 | Short-circuit S+ | OR | 1 | 0 |
| 0 | 0 | Interrupt S+ | CR | 0 | 0 |
| 1 | 0 | Short-circuit S- | OR | 0 | 0 |
| 0 | 0 | Interrupt S- | OR | 0 | 0 |
| 1 | 1 | Short-circuit S- 5-16 V | AND | 1 | 0 |

TABLE 1-continued

| LOGS+ | LOGS- | Commentary | Type of Logic Operation | RXD | ERROR |
|---|---|---|---|---|---|
| 0 | 1 | | AND | 0 | 0 |
| 0 | 0 | Short-circuit S+ S- | OR | 0 | 0 |
| 0 | 1 | | OR | 1 | 0 |

What is claimed is:

1. A device for a serial transmission of data between at least two terminals, one of the at least two terminals for transmitting data and one of the at least two terminals for receiving the transmitted data, the at least two terminals being connected via a two-wire line, comprising:

a bus-coupling circuit in each of the at least two terminals, the bus-coupling circuit in the terminal for transmitting data having at least one transmitting section and the bus-coupling circuit in the terminal for receiving the transmitted data having at least one receiving section, the bus-coupling circuit being controlled by a control unit;

wherein the at least one transmitting section receives the serial transmission of data and includes a first driver circuit and a second driver circuit, the first driver circuit being connected to a first wire of the two-wire line and providing a first signal on the first wire determined as a function of the transmitted data, the second driver circuit being connected to a second wire of the two-wire line and providing a second signal on the second wire determined as a function of the transmitted data, the second signal being complementary of the first signal;

wherein the at least one receiving section includes at least a first comparator and a second comparator, the first comparator having a first input connected to the first wire, a second input connected to a first preselected reference potential, and a first output signal, the second comparator having a third input connected to the second wire, a fourth input connected to a second preselected reference potential, and a second output signal;

a resistor network coupled between the first driver circuit, the second driver circuit, the first wire and the second wire, wherein the first driver circuit is connected via a first resistor to the first wire, the second driver circuit is connected via a second resistor to the second wire, the first wire being connected via a third resistor to a first supply potential, the second wire being connected via a fourth resistor to a second supply potential, and wherein a first resistance ratio of the first resistor to the second resistor is substantially the same as a second resistance ratio of the third resistor to the fourth resistor, each of the first and second resistance ratios having a value other than one;

an evaluation circuit coupled to the first comparator and to the second comparator, the evaluation circuit receiving the first output signal and the second output signal to determine whether the two-wire line is in one of a first state representing an error-free condition and a second state representing an error condition;

wherein when the two-wire line is in the first state, the evaluation circuit performs a first operation on the first output signal and the second output signal to obtain a first result dependent upon the first output signal and the second output signal, and when the two-wire line is in the second state, the evaluation circuit performs a second operation on the first output signal and the second output signal to obtain a second result dependent upon one of the first output signal and the second output signal.

2. The device according to claim 1, wherein the second supply potential includes a ground potential.

3. A device for a serial transmission of data between at least two terminals, one of the at least two terminals for transmitting data and one of the at least two terminals for receiving the transmitted data, the at least two terminals being connected via a two-wire line, comprising:

a bus-coupling circuit in each of the at least two terminals, the bus-coupling circuit in the terminal for transmitting data having at least one transmitting section and the bus-coupling circuit in the terminal for receiving the transmitted data having at least one receiving section, the bus-coupling circuit being controlled by a control unit;

wherein the at least one transmitting section receives the serial transmission of data and includes a first driver circuit and a second driver circuit, the first driver circuit being connected to a first wire of the two-wire line and providing a first signal on the first wire determined as a function of the transmitted dam, the second driver circuit being connected to a second wire of the two-wire line and providing a second signal on the second wire determined as a function of the transmitted dam, the second signal being complementary of the first signal;

wherein the at least one receiving section includes at least a first comparator and a second comparator, the first comparator having a first input connected to the first wire, a second input connected to a first preselected reference potential, and a first output signal, the second comparator having a third input connected to the second wire, a fourth input connected to a second preselected reference potential, and a second output signal;

a resistor network coupled between the first driver circuit, the second driver circuit, the first wire and the second wire;

an evaluation circuit coupled to the first comparator and to the second comparator, the evaluation circuit receiving the first output signal and the second output signal to determine whether the two-wire line is in one of a first state representing an error-free condition and a second state representing an error condition;

wherein when the two-wire line is in the first state, the evaluation circuit performs a first operation on the first output signal and the second output signal to obtain a first result dependent upon the first output signal and the second output signal, and when the two-wire line is in the second state, the evaluation circuit performs a second operation on the first output signal and the second output signal to obtain a second result dependent upon one of the first output signal and the second output signal, and wherein when the two-wire line is in the second state of the short circuit between the first wire and the second wire, the first preselected reference potential includes a value between a range of potentials resulting from the short circuit between the first wire and the second wire, and the second preselected reference potential is outside the range of potentials.

4. The device according to claim 3, wherein the first preselected reference potential is approximately midway between the range of potentials.

5. A device for a serial transmission of data between at least two terminals, one of the at least two terminals for transmitting data and one of the at least two terminals for receiving the transmitted data, the at least two terminals being connected via a two-wire line, comprising:

a bus-coupling circuit in each of the at least two terminals, the bus-coupling circuit in the terminal for transmitting data having at least one transmitting section and the bus-coupling circuit in the terminal for receiving the transmitted data having at least one receiving section, the bus-coupling circuit being controlled by a control unit;

wherein the at least one transmitting section receives the serial transmission of data and includes a first driver circuit and a second driver circuit, the first driver circuit being connected to a first wire of the two-wire line and providing a first signal on the first wire determined as a function of the transmitted dam, the second driver circuit being connected to a second wire of the two-wire line and providing a second signal on the second wire determined as a function of the transmitted data, the second signal being complementary of the first signal;

wherein the at least one receiving section includes at least a first comparator and a second comparator, the first comparator having a first input connected to the first wire, a second input connected to a first preselected reference potential, and a first output signal, the second comparator having a third input connected to the second wire, a fourth input connected to a second preselected reference potential, and a second output signal;

a resistor network coupled between the first driver circuit, the second driver circuit, the first wire and the second wire;

an evaluation circuit coupled to the first comparator and to the second comparator, the evaluation circuit receiving the first output signal and the second output signal to determine whether the two-wire line is in one of a first state representing an error-free condition and a second state representing an error condition;

wherein when the two-wire line is in the first state, the evaluation circuit performs a first operation on the first output signal and the second output signal to obtain a first result dependent upon the first output signal and the second output signal, and when the two-wire line is in the second state, the evaluation circuit performs a second operation on the first output signal and the second output signal to obtain a second result dependent upon one of the first output signal and the second output signal, and wherein the first operation performed by the evaluation circuit includes an AND logic operation and the second operation performed by the evaluation circuit includes an OR logic operation.

6. The device according to claim 5, wherein a selection of one of the AND logic operation and the OR logic operation to be performed by the evaluation circuit is determined by a logic circuit of the evaluation circuit as a function of the first output signal and the second output signal, the selection of one of the AND logic operation and the OR logic operation being stored in a bistable circuit element, each state of the bistable circuit element corresponding to one of the AND logic operation and the OR logic operation.

7. The device according to claim 6, wherein
the logic circuit includes a first AND gate having the first output signal and the second output signal as inputs,
a first OR gate having an inverted output coupled to an inverter circuit, the first OR gate having the first output signal and the second output signal as inputs, the bistable circuit element having a set input coupled to an output of the first AND gate, a reset input coupled to the inverted output of the first OR gate, an output coupled to an input of a second AND gate, and an inverted output coupled to an input of a third AND gate, the second AND gate having a second input coupled to the output of the first AND gate and an output coupled to an input of a second OR gate, and the third AND gate having a second input coupled to an output of the inverter circuit and an output coupled to the second OR gate.

8. A method for serially transmitting data between at least two terminals, one of the at least two terminals for transmitting data and one of the at least two terminals for receiving the transmitted data, the at least two terminals being connected via a two-wire line, comprising the steps of:

receiving serially transmitted data in a first bus-coupling circuit of the terminal for transmitting data, the first bus-coupling circuit having at least one transmitting section and being controlled by a first microcomputer;

providing a first signal on a first wire of the two-wire line determined as a function of the transmitted data;

providing a second signal on a second wire of the two-wire line determined as a function of the transmitted data, the second signal being complementary of the first signal;

receiving the transmitted data, via the first signal on the first wire and the second signal on the second wire, in a second bus-coupling circuit in the terminal for receiving the transmitted data, the second bus-coupling circuit having at least one receiving section;

comparing the first signal to a first selected reference potential to generate a first output signal and comparing the second signal to a second selected reference potential to generate a second output signal;

evaluating the first output signal and the second output signal to determine one of an error-free state of the two-wire line and an error-condition state of the two-wire line;

when the two-wire line is in an error-free state, performing a first operation on the first output signal and the second output signal to obtain a result based on the first output signal and the second output signal; and when the two-wire line is in an error-condition state, performing a second operation on the first output signal and the second output signal to obtain a result based on one of the first output signal and the second output signal, wherein the error-condition state of the two-wire line includes one of a short circuit of the first wire to a voltage, a short circuit of the second wire to the voltage, and a short circuit between the first wire and the second wire, and wherein when the two-wire line is in the error-condition state of the short circuit between the first wire and the second wire, the first selected reference potential includes a value between a range of potentials resulting from the short circuit between the first wire and the second wire, and the second selected reference potential is outside the range of potentials.

9. A method for serially transmitting data between at least two terminals, one of the at least two terminals for transmitting data and one of the at least two terminals for receiving the transmitted data, the at least two terminals being connected via a two-wire line, comprising the steps of:

receiving serially transmitted data in a first bus-coupling circuit of the terminal for transmitting data, the first bus-coupling circuit having at least one transmitting section and being controlled by a first microcomputer;

providing a first signal on a first wire of the two-wire line determined as a function of the transmitted data;

providing a second signal on a second wire of the two-wire line determined as a function of the transmitted data, the second signal being complementary of the first signal;

receiving the transmitted data, via the first signal on the first wire and the second signal on the second wire, in a second bus-coupling circuit in the terminal for receiving the transmitted data, the second bus-coupling circuit having at least one receiving section;

comparing the first signal to a first selected reference potential to generate a first output signal and comparing the second signal to a second selected reference potential to generate a second output signal;

evaluating the first output signal and the second output signal to determine one of an error-free state of the two-wire line and an error-condition state of the two-wire line;

when the two-wire line is in an error-free state, performing a first operation on the first output signal and the second output signal to obtain a result based on the first output signal and the second output signal; and when the two-wire line is in an error-condition state, performing a second operation on the first output signal and the second output signal to obtain a result based on one of the first output signal and the second output signal, wherein the step of performing the first operation includes an AND logic operation and the step of performing the second operation includes an OR logic operation, and further comprising the step of selecting one of the AND logic operation and the OR logic operation as a function of the first output signal and the second output signal, the selection of one of the AND logic operation and the OR logic operation being stored in a bistable circuit element, each state of the bistable circuit element corresponding to one of the AND logic operation and the OR logic operation.

* * * * *

UNITED STATES PATENT AND TRADEMARK OFFICE
CERTIFICATE OF CORRECTION

PATENT NO.   : 5,696,777
DATED        : Dec. 9, 1997
INVENTOR(S)  : Hofsaess

It is certified that error appears in the above-identified patent and that said Letters Patent is hereby corrected as shown below:

Column 2, line 25, "operation" should be -- operations --.

Column 7, line 64, "CR 0 0" should be -- OR 0 0 --.

Column 7, line 65, "OR 00" should be -- OR 1 0 --.

Column 9, line 25, "dam," should be -- data, --.

Column 9, line 29, "dam," should be -- data, --.

Column 10, line 18, "dam," should be -- data, --.

Signed and Sealed this

Twenty-fourth Day of November, 1998

Attest:

BRUCE LEHMAN

*Attesting Officer*　　　*Commissioner of Patents and Trademarks*